(12) United States Patent
Huang et al.

(10) Patent No.: US 11,669,670 B2
(45) Date of Patent: *Jun. 6, 2023

(54) PHOTOMASK AND METHOD FOR MANUFACTURING PHOTOMASK AND SEMICONDUCTOR STRUCTURE THEREOF

(71) Applicant: TAIWAN SEMICONDUCTOR MANUFACTURING COMPANY LTD., Hsinchu (TW)

(72) Inventors: Chin-Min Huang, Taichung (TW); Ching-Hung Lai, Taipei (TW); Jia-Guei Jou, New Taipei (TW); Yin-Chuan Chen, Hsinchu (TW); Chi-Ming Tsai, Taipei (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 66 days.

This patent is subject to a terminal disclaimer.

(21) Appl. No.: 17/115,466

(22) Filed: Dec. 8, 2020

(65) Prior Publication Data

US 2021/0089701 A1 Mar. 25, 2021

Related U.S. Application Data

(62) Division of application No. 16/141,112, filed on Sep. 25, 2018, now Pat. No. 10,867,107.

(51) Int. Cl.
*G06F 30/39* (2020.01)
*G06F 30/398* (2020.01)
*G03F 1/36* (2012.01)
*H01L 21/027* (2006.01)

(52) U.S. Cl.
CPC ............. *G06F 30/398* (2020.01); *G03F 1/36* (2013.01); *H01L 21/0274* (2013.01)

(58) Field of Classification Search
CPC ....... G06F 30/398; G03F 1/36; H01L 21/0274
USPC .......................................................... 716/53
See application file for complete search history.

(56) References Cited

U.S. PATENT DOCUMENTS

| | | | |
|---|---|---|---|
| 2006/0200790 A1* | 9/2006 | Shang | G03F 1/36 716/54 |
| 2014/0331191 A1* | 11/2014 | Wu | G06F 30/398 716/53 |
| 2015/0234269 A1* | 8/2015 | Azpiroz | G03F 1/76 430/5 |

* cited by examiner

*Primary Examiner* — Paul Dinh

(74) *Attorney, Agent, or Firm* — WPAT Law; Anthony King

(57) ABSTRACT

A method for forming a photomask is provided. The method includes: receiving an initial layout, the initial layout comprising a first pattern and a second pattern; decomposing the initial layout into a first layout including the first pattern and a second layout including the second pattern; inserting a third pattern into the first layout; overlapping the first layout including the first pattern and the third pattern to the second layout including the second pattern; increasing a width of the third pattern in the first layout overlapping the second pattern in the second layout to form a fourth pattern in the first layout; and outputting the first layout comprising the first pattern, the third pattern and the fourth pattern into a first photomask.

20 Claims, 20 Drawing Sheets

M10

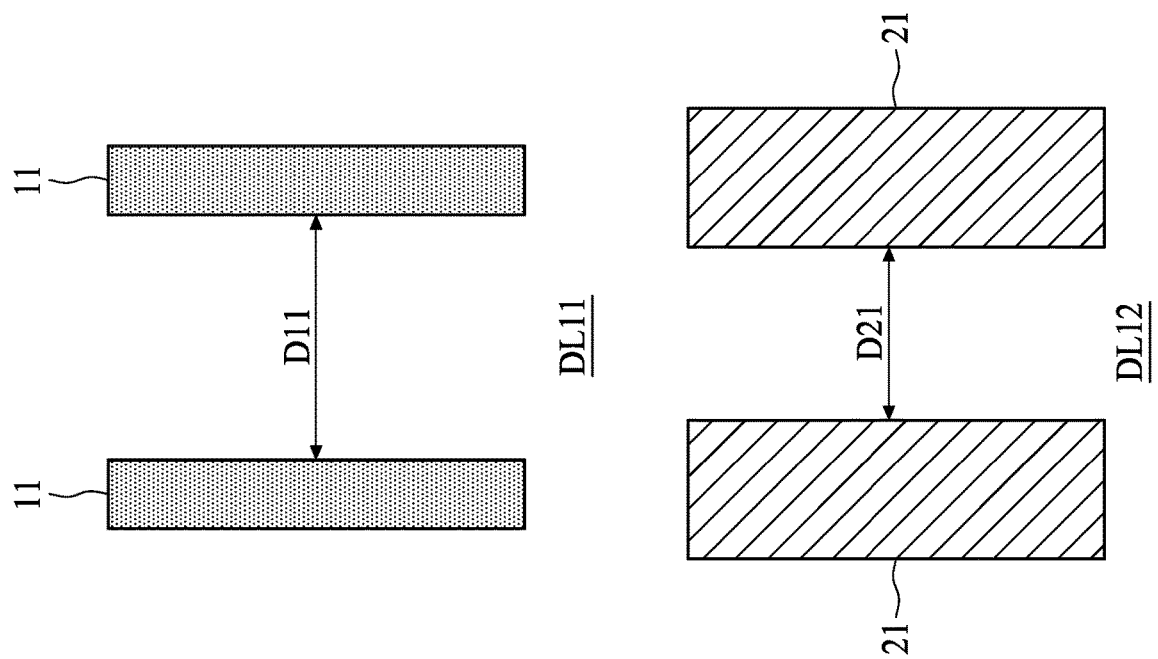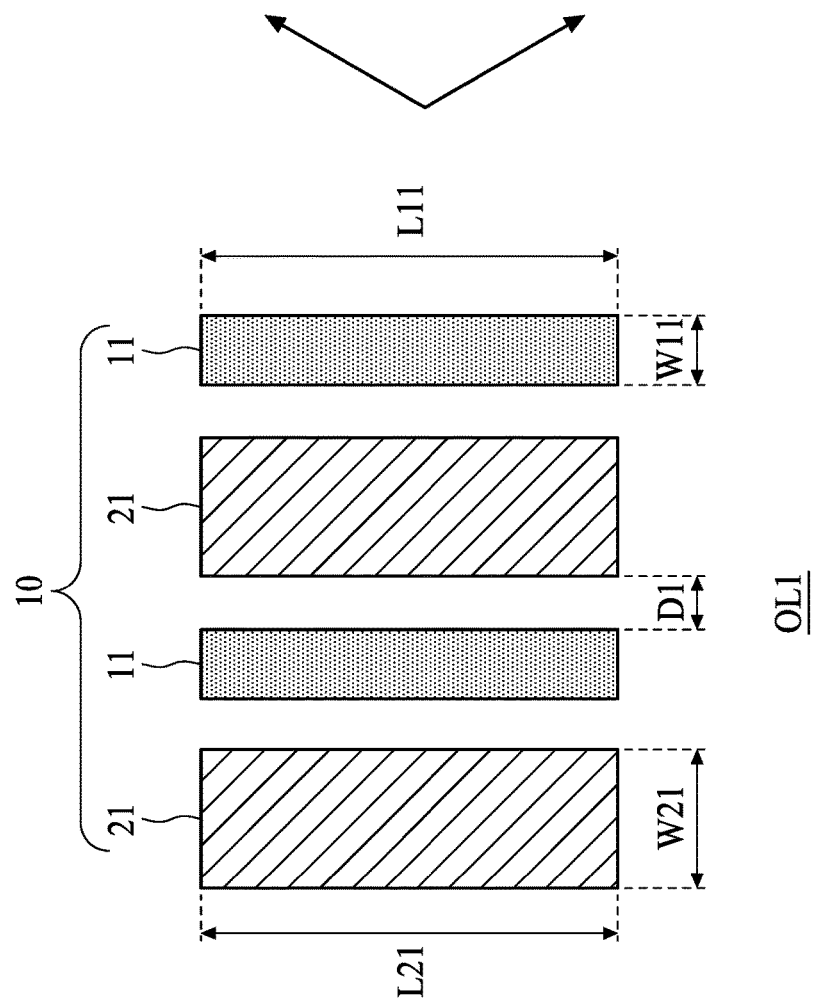
FIG. 2

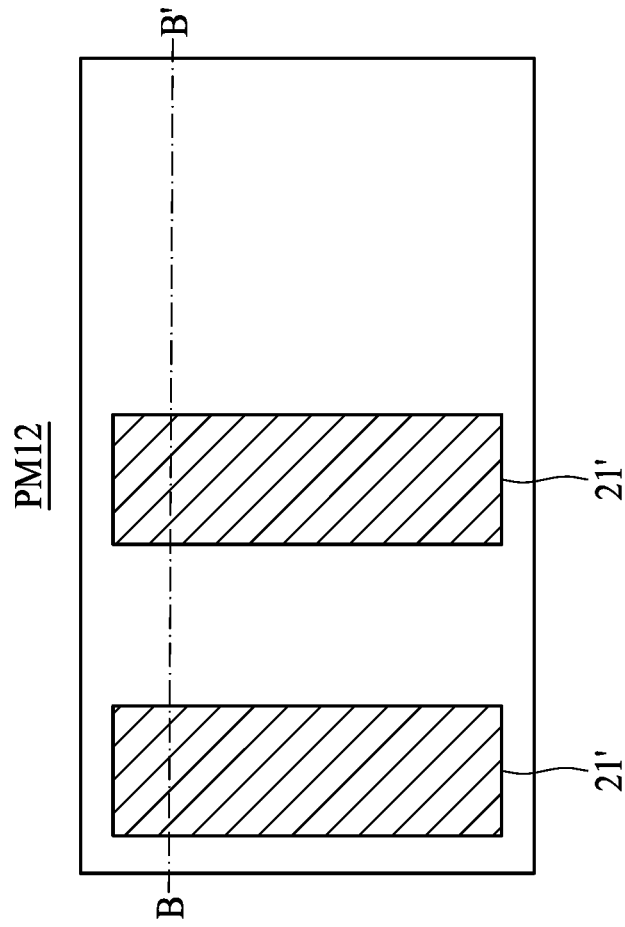
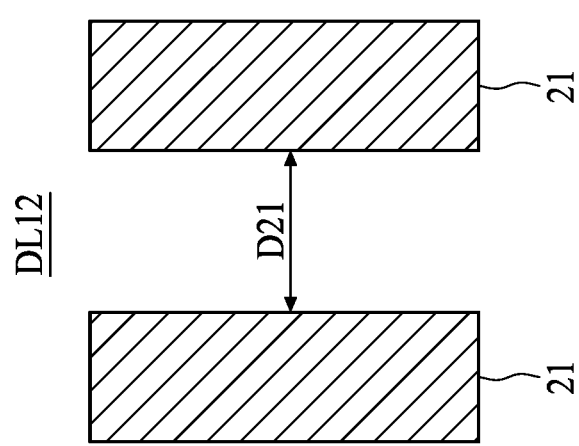
FIG. 9

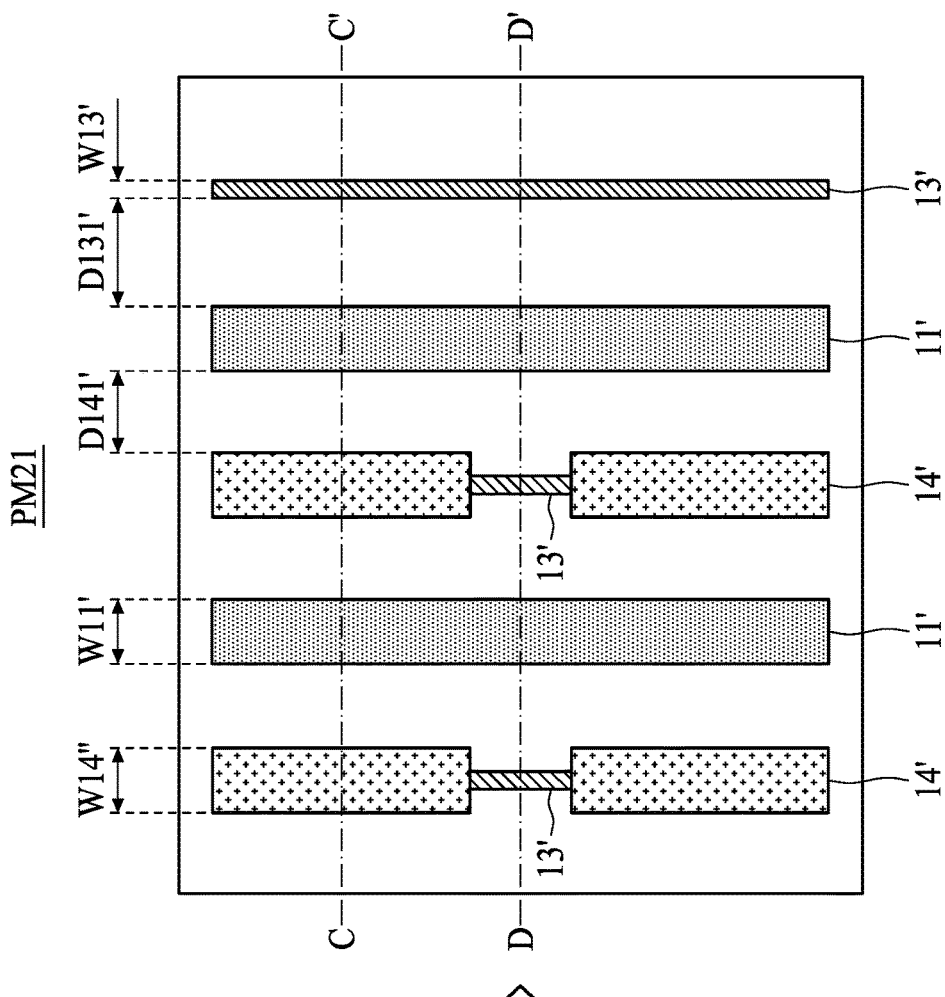
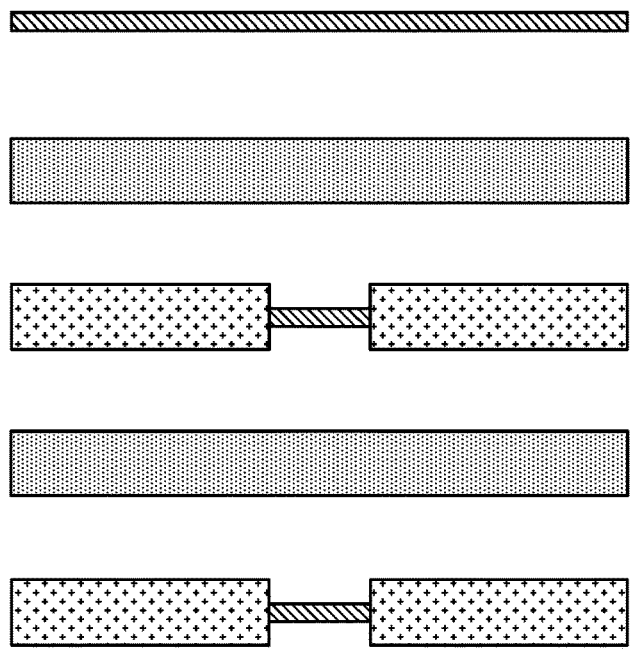
FIG. 13

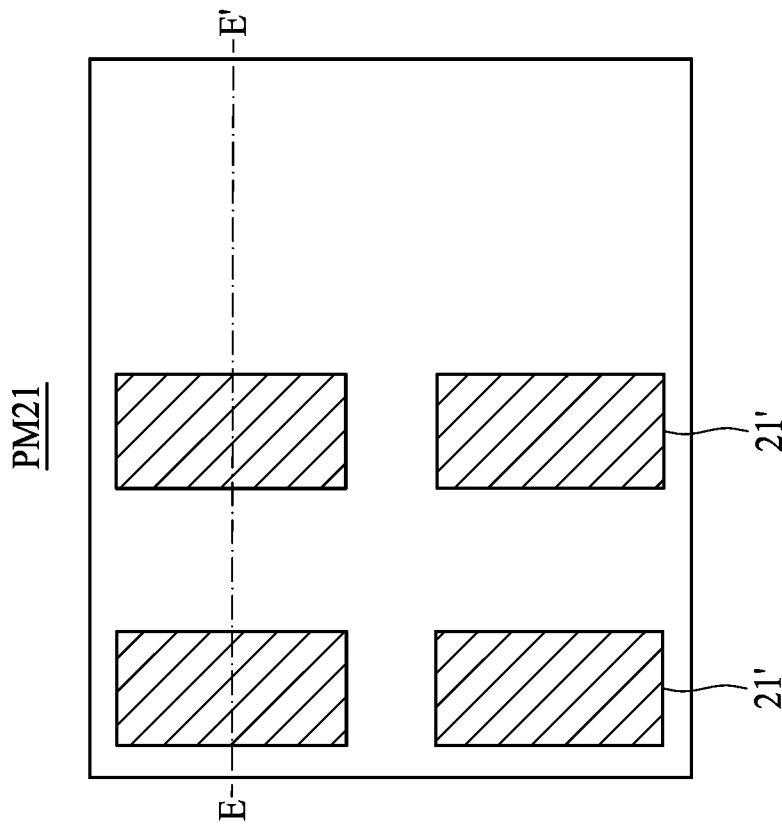
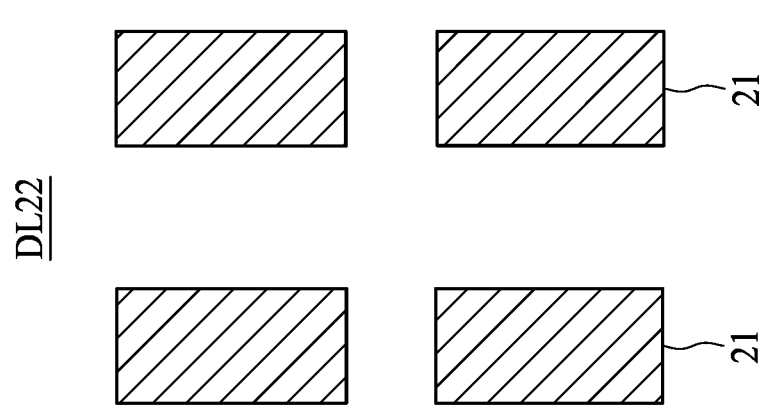
FIG. 16 ics. The basic principle of optical lithography is quite similar to that of film photography. The images of the patterned photomask are projected through a high-precision optical lithography tool onto the wafer surface, which is coated with a layer formed of a light-sensitive chemical compound, e.g. photo-resist. Patterns are then formed on the wafer surface after complex chemical reactions and subsequent manufacturing steps, such as development, post-exposure baking, and wet or dry etching.

PHOTOMASK AND METHOD FOR MANUFACTURING PHOTOMASK AND SEMICONDUCTOR STRUCTURE THEREOF

PRIORITY CLAIM AND CROSS-REFERENCE

This patent is a divisional application of U.S. patent application Ser. No. 16/141,112 filed on Sep. 25, 2018, now U.S. Pat. No. 10,867,107 issued on Dec. 15, 2020, and entitled of "METHOD FOR MANUFACTURING PHOTOMASK AND SEMICONDUCTOR THEREOF", which is incorporated by reference in its entirety.

BACKGROUND

A typical semiconductor manufacturing process includes numerous steps. Optical lithography is a crucial step in semiconductor manufacturing. The basic principle of optical lithography is quite similar to that of film photography. The images of the patterned photomask are projected through a high-precision optical lithography tool onto the wafer surface, which is coated with a layer formed of a light-sensitive chemical compound, e.g. photo-resist. Patterns are then formed on the wafer surface after complex chemical reactions and subsequent manufacturing steps, such as development, post-exposure baking, and wet or dry etching.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

FIGS. 2 to 7 are diagrams showing one or more operations of a method for forming a photomask in accordance with some embodiments of the present disclosure.

FIG. 9 is a diagram showing one or more operations of a method for forming a photomask in accordance with some embodiments of the present disclosure.

FIGS. 1 to 13 are diagrams showing one or more operations of a method for forming a photomask in accordance with some embodiments of the present disclosure.

FIG. 16 is a diagram showing one or more operations of a method for forming a photomask in accordance with some embodiments of the present disclosure.

DETAILED DESCRIPTION

Figure 1:
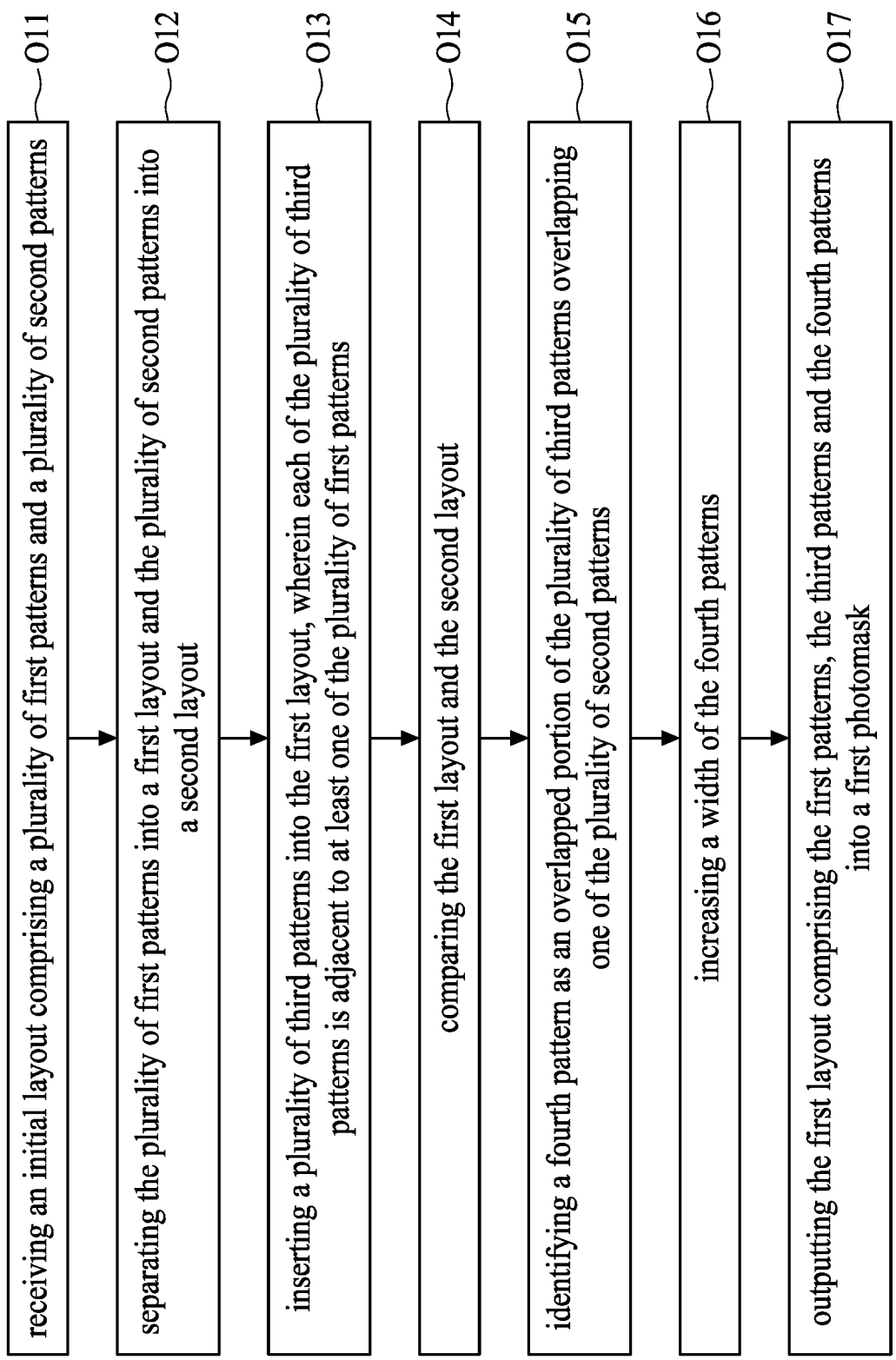
FIG. 1 is a flowchart in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to +10% of that numerical value, such as less than or equal to 5%, less than or equal to ±4%, less than or equal to 3%, less than or equal to 2%, less than or equal to 1%, less than or equal to ±0.5%, less than or equal to 0.1%, or less than or equal to 0.05%. For example, two numerical values can be deemed to be "substantially" the same or equal if a difference between the values is less than or equal to ±10% of an average of the values, such as less than or equal to 5%, less than or equal to +4%, less than or equal to 3%, less than or equal to 2%, less than or equal to ±1%, less than or equal to ±0.5%, less than or equal to 0.1%, or less than or equal to 0.05%. For example, "substantially" parallel can refer to a range of angular variation relative to 0° that is less than or equal to 10°, such as less than or equal to 5°, less than or equal to ±4, less than or equal to 3, less than or equal to 20, less than or equal to 1°, less than or equal to 0.5, less than or equal to 0.1°, or less than or equal to 0.05°. For example, "substantially" perpendicular can refer to a range of angular variation relative to 90° that is less than or equal to 10°, such as less than or equal to 5°, less than or equal to +4°, less than or equal to +3°, less than or equal to +2°, less than or equal to ±1, less than or equal to 0.5°, less than or equal to 0.1°, or less than or equal to +0.05°.

The advanced lithography process, method, and materials described in the current disclosure can be used in many applications, including fin-type field effect transistors (FinFETs). For example, the fins may be patterned to produce a relatively close spacing between features, for which the current disclosure is well suited. In addition, spacers used in forming fins of FinFETs can be processed according to the current disclosure.

In order to enhance resolution and further decrease dimensions of a semiconductor device in semiconductor manufacturing, techniques of layout decomposition are applied to develop an initial layout into several layouts. One or more scattering bars are inserted to at least one of the several layouts for producing a good lithographic result. The scattering bar is not printable onto a photomask, and thus avoids wafer damage by lithographic process. This results in a constrained process window because the dimensions of the scattering bar are limited.

Some embodiments of the present disclosure provide a method for forming a photomask. The method according to some embodiments of the present disclosure includes operations to enlarge a dimension of at least a portion of a scattering bar of a decomposed layout. The enlargement of the scattering bar is intended to produce a good lithographic result due to characteristics of optical diffraction. The enlargement is performed on a portion of the scattering bars that overlaps with other decomposed layouts. When the initial layout is decomposed into at least two layouts, at least a scattering bar is inserted into one of the at least two layouts. The enlargement is performed on the portion of the scattering bar (or scattering bars) that overlaps patterns of another layout, and thus the lithographic result can be enhanced due to an enlarged process window. No pattern is changed on a target layer of, for example, a semiconductor wafer.

To illustrate concepts of the present disclosure, various embodiments with the method applied are provided in the following description. However, such embodiments are not intended to limit the present disclosure.

As shown in FIG. 1, some embodiments of the present disclosure provide a method M10 for forming a photomask. The method M10 includes. (O11) receiving an initial layout comprising a plurality of first patterns and a plurality of second patterns; (O12) separating the plurality of first patterns into a first layout and the plurality of second patterns into a second layout; (O13) inserting a plurality of third patterns into the first layout, wherein each of the plurality of third patterns is adjacent to at least one of the plurality of first patterns; (O14) comparing the first layout and the second layout; (O15) identifying a fourth pattern as an overlapping portion of the plurality of third patterns overlapping one of the plurality of second patterns; (O16) increasing a width of the fourth patterns; and (O17) outputting the first layout comprising the first patterns, the third patterns and the fourth patterns into a first photomask.

In accordance with operation (O11) of the method M10 and some embodiments of the disclosure, referring to FIG. 2, an initial layout OL1 is received. The initial layout OL1 includes a plurality of original patterns 10. The original patterns 10 are separated from each other by an original spacing distance D1. The original patterns 10 of the initial layout OL1 include a plurality of first patterns 11 and a plurality of second patterns 21. The first patterns 11 have a width W11 and a length L11, and the second patterns 21 have a width W21 and a length L21. For ease of illustration and understanding, in some embodiments of the present disclosure, the original spacing distances D1 between adjacent original patterns 10 are the same, and each of the original patterns 10 is a polygon. In some embodiments, each of the original patterns 10 is configured as a rectangle. In some embodiments, each of the first patterns 11 has the same configuration, and each of the second patterns 21 has the same configuration, but the disclosure is not limited thereto. In some embodiments, the width W21 of the second patterns 21 is greater than the width W11 of the first patterns 11, but the disclosure is not limited thereto. In some embodiments, the length L21 of the second patterns 21 is approximately or substantially equal to (i.e., a difference between the values is less than or equal to ±10%) the length L11 of the first patterns 11. In some embodiments, the length L21 of the second patterns 21 is the same as the length L11 of the first patterns 11.

In accordance with operation (O12) of the method M10 and some embodiments of the disclosure, referring to FIG. 2, the initial layout OL1 is decomposed into a first layout DL11 and a second layout DL12 by a decomposition operation, which is also referred to as a coloring operation. The plurality of first patterns 11 of the original patterns 10 is separated into the first layout DL11, and the plurality of second patterns 21 of the original patterns 10 is separated into a second layout DL12. In other words, the plurality of original patterns 10 of the initial layout OL1 is decomposed into the plurality of first patterns 11 and the plurality of second patterns 21 of two different layouts DL11 and DL21. The first patterns 11 are separated from each other by a spacing distance D11, and the second patterns are separated from each other by a spacing distance D21. The spacing distance D21 of the second patterns 21 is greater than the original spacing distance D1. The spacing distance D11 of the first patterns 11 is greater than the original spacing distance D1 and the second spacing distance D21. In such embodiments, the original layout OL1 is decomposed into two layouts DL11 and DL12 that may be used to form patterns in a same layer, such as a metal layer or any other layer involved in the formation of integrated circuits, such as a polysilicon layer. In some embodiments, an initial layout is decomposed into more than two layouts.

The decomposition operation can be performed based on the original spacing distance D1. To meet requirements of smaller dimensions and higher resolution, the original spacing distance D1 can be smaller than a minimum distance of previous embodiments, thereby achieving a resolution that exceeds a resolution limit of existing optical lithography tools used to pattern or develop a target layer of a semiconductor wafer in a given semiconductor fabrication technology generation. The original spacing distance D1 can vary, depending on applications and generations of semiconductor processing tools. However, once the original spacing distance D1 exceeds a default spacing distance (a default spacing distance also can vary, depending on the optical lithography tool used), the adjacent original patterns 10 are separated into different layouts for multiple-patterning operations. The decomposition operation can be repeatedly performed on the first layout DL11 and the second layout DL12 until a spacing distance between adjacent patterns on the same layout is not smaller than the default spacing distance. However, in other embodiments, the initial patterns 10 may be decomposed due to considerations other than tight spacing.

Figure 3:
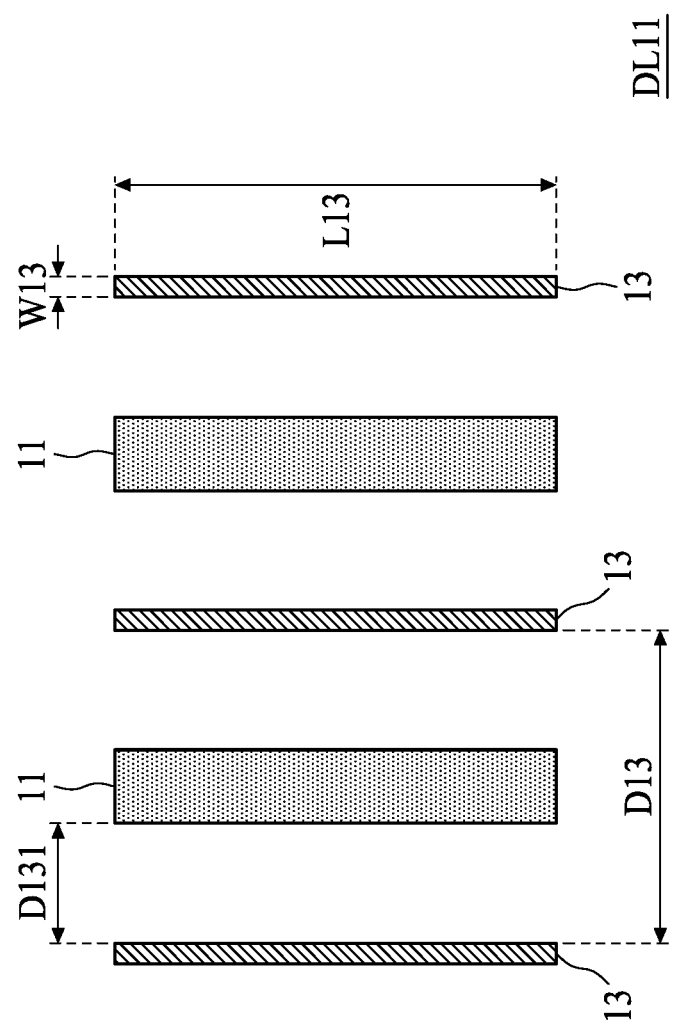

In accordance with operation (O13) of the method M10 and some embodiments of the disclosure, referring to FIG. 3, a plurality of third patterns 13 are inserted into the first layout DL11, wherein each of the plurality of third patterns 13 is adjacent to at least one of the plurality of first patterns 11. In some embodiments, the third patterns 13 are non-printable scattering bars. In some embodiments, a dimension of the third patterns 13 is less than a dimension of the second patterns 21 and a dimension of the first patterns 11. In some embodiments, the third patterns 13 are inserted into a layout (formed after decomposition) having greater spacing distances between the patterns and/or smaller dimensions of the patterns as compared to other layouts.

For ease of illustration and understanding, the third patterns 13 are polygonal, and in embodiments such as the embodiment shown in FIG. 3, the third patterns 13 are rectangles with same widths and same lengths, wherein the third patterns 13 have a length L13 and a width W13. The width W13 of the third patterns 13 is less than the width W11 of the first patterns 11 and the width W21 of the second patterns 21. The third patterns 13 are separated from each other by a spacing distance D13, and adjacent first and third patterns 11 and 13 are separated by a spacing distance D131. In some embodiments, the third patterns 13 are individually disposed between the first patterns 11 and separated from the first patterns 11 by the spacing distances D131, wherein the spacing distances D131 are the same. The third patterns 13 are inserted for balancing density of patterns within the first layout DL11 so that isolated features to be formed can achieve performance comparable to that of dense features to be formed. In some embodiments, diagrams of the first layout DL11 shown in the figures represent only a portion of the first layout DL11 having low density of the first patterns 11.

Figure 4:
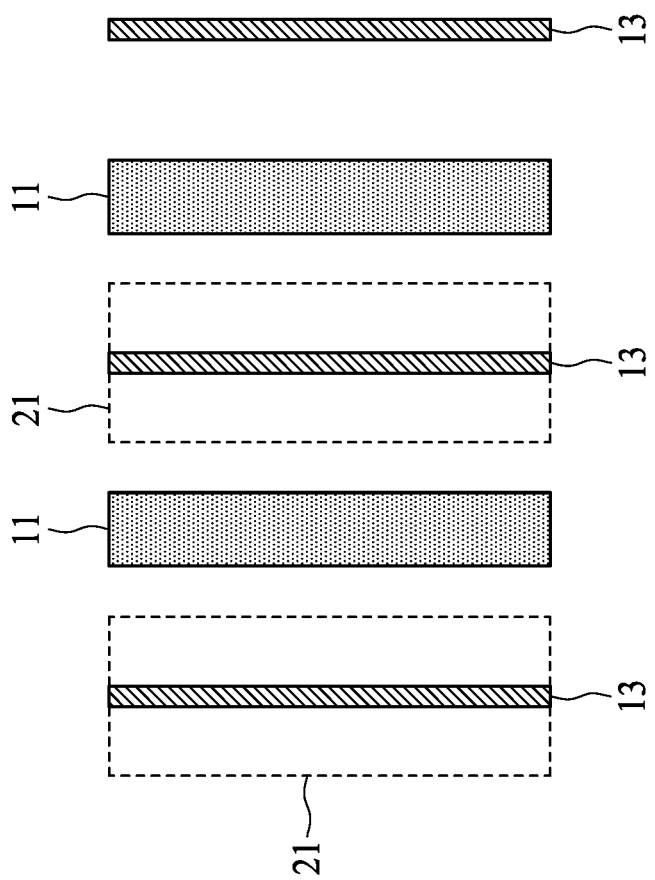

In accordance with operation (O14) of the method M10 and some embodiments of the disclosure, referring to FIG. 4, the first layout DL11 is compared with the second layout DL12 after insertion of the third patterns 13. FIG. 4 shows the second patterns 21 of the second layout DL12 in dotted lines overlaid on the first layout DL11 to show relative positions of the first patterns 11, the second patterns 21 and the third patterns 13 of the first layout DL11 and the second layout DL12.

Figure 5:
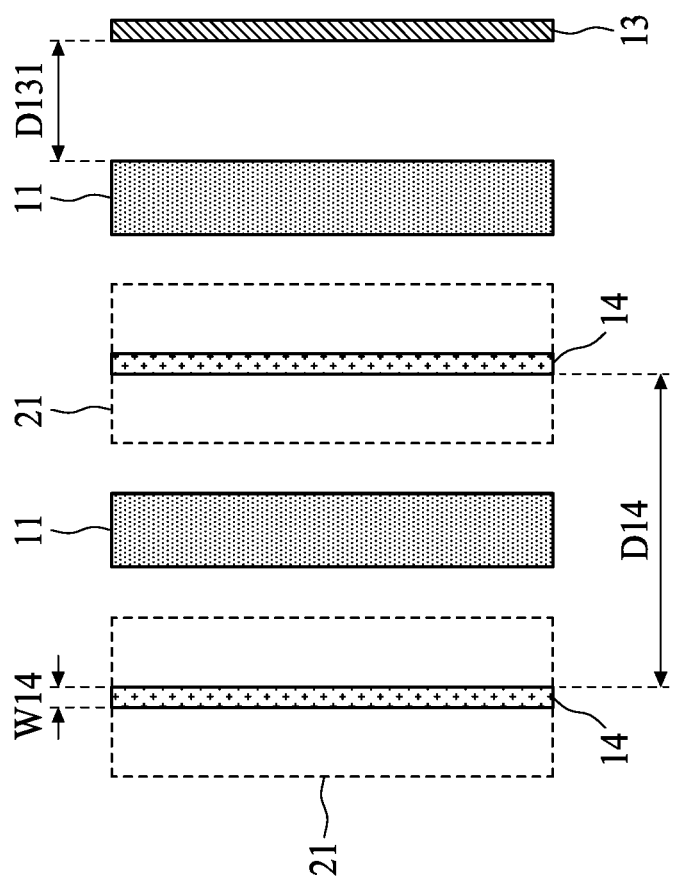

In accordance with operation (O15) of the method M10 and some embodiments of the disclosure, referring to FIG. 5, an overlapping portion of the plurality of third patterns 13 overlapping one of the plurality of second patterns 21 is identified as a fourth pattern 14. In embodiments such as the embodiment shown in FIG. 5, the two third patterns 13 on the left hand side overlap the second patterns 21 of the second layout DL12, and thus the two third patterns 13 are identified as the fourth patterns 14. The fourth patterns 14 have a width W14 equal to the width W13, and a spacing distance D14 between adjacent fourth patterns 14 is equal to the spacing distance D13.

Figure 6:
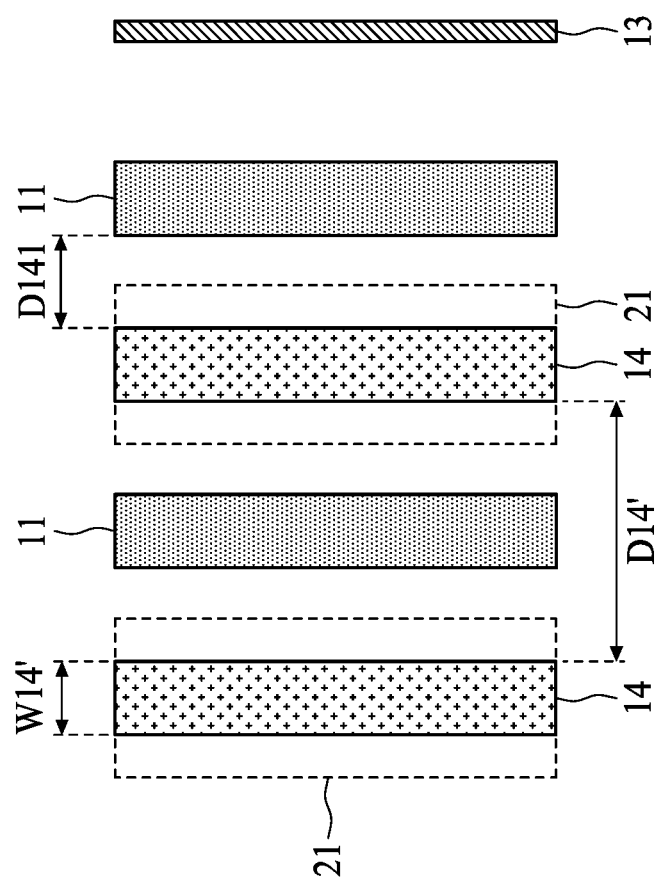

In accordance with operation (O16) of the method M10 and some embodiments of the disclosure, referring to FIG. 6, the width W14 of the fourth patterns 14 is increased to a width W14'. After the width W14 is increased, the fourth pattern 14 entirely overlaps a corresponding second pattern 21 when the second layout DL12 overlaps the first layout DL11, as shown in FIG. 6. The fourth pattern 14 having the width W14' is entirely within a coverage area of the second pattern 21 when the second layout DL12 overlaps the first layout DL11.

In some embodiments, the fourth patterns 14 are printable scattering bars. In some embodiments, the width W14' of the fourth patterns 14 is approximately or substantially equal to the first width W11 of the first patterns 11, wherein a difference between the values is less than or equal to ±10%. In some embodiments, the width W14' of the fourth patterns 14 is the same as the first width W11 of the first patterns 11. In some embodiments, a spacing distance D14' between adjacent fourth patterns 14 after a width increase is approximately or substantially equal to the first spacing distance D11 of the first patterns 11, wherein a difference between the values is less than or equal to +10%. In some embodiments, the spacing distance D14' of the fourth patterns 14 after the width increase is the same as the first spacing distance D11 of the first patterns 11. In some embodiments, spacing distances D141 between the first patterns 11 and adjacent fourth patterns 14 having the width W14' are substantially equal; that is, a difference between the values is less than or equal to ±10%. In some embodiments, the spacing distances D141 between the fourth patterns 14 and adjacent first patterns 11 are the same. Thus, with the fourth patterns 14 and the first patterns 11, the first layout DL11 has more repetitive and periodic patterns.

Moreover, the enlarged third patterns (i.e. the fourth patterns 14) also provide a larger process window. In general, as is well known in the art, the term "process window" refers the amount of variation in exposure dose and focus which can be tolerated so that the characteristics of features (e.g., line width, wall angle, resist thickness) are maintained within prescribed specifications. Further, the usable focus range or depth of focus (DOF) typically refers to the range of focus settings wherein the lateral dimension of the feature or the space between features lies within a prescribed specification of a targeted line width or critical dimension (CD). The process window can be increased and the DOF can be improved by forming the fourth patterns 14 having the width 14' greater than the width 13 of the third patterns 13.

In some embodiments, the third pattern 13 (e.g., a non-printable scattering bar) is separated from the fourth pattern 14 (e.g., a printable scattering bar).

Figure 7:
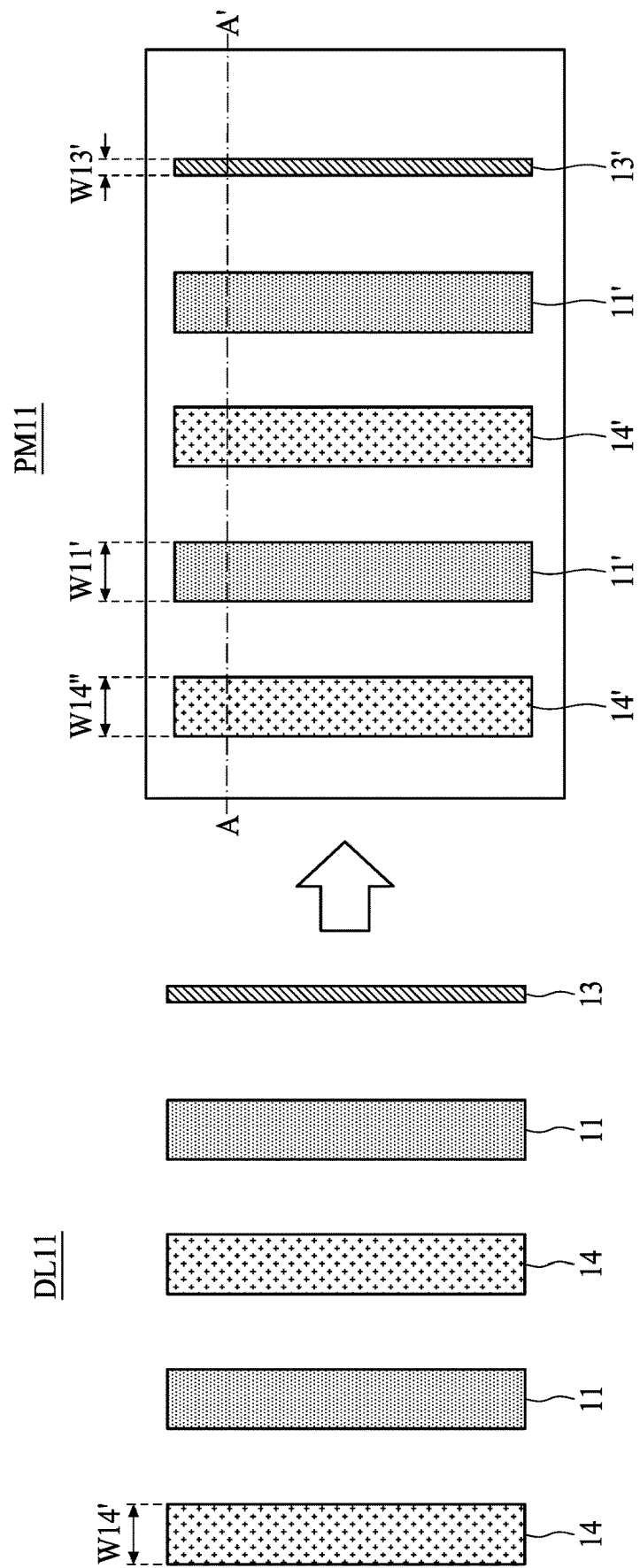
Figure 8:
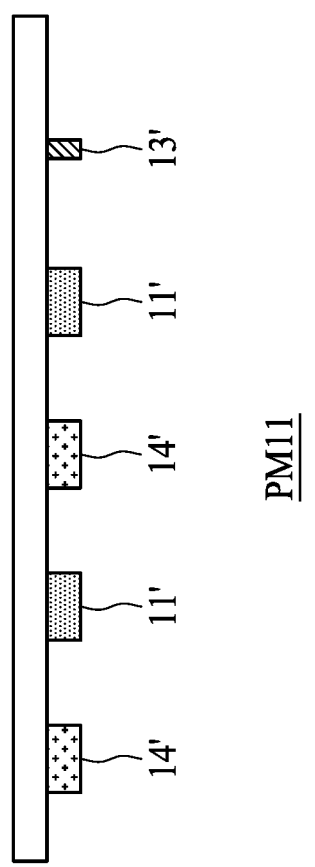
FIG. 8 is a cross-sectional view of a photomask in accordance with some embodiments of the present disclosure.

In accordance with operation (O17) of the method M10 and some embodiments of the disclosure, referring to FIG. 7, the first layout DL11, including the first patterns 11, the third patterns 13 and the fourth patterns 14 having the width W14', is outputted into a first photomask PM11. The first photomask PM11 includes a plurality of patterns 11' corresponding to the first patterns 11, at least a pattern 13' corresponding to the third pattern 13, and a plurality of patterns 14' corresponding to the fourth patterns 14 of the first layout DL11. The first photomask PM11 is used, e.g. in a double-patterning operation or a multiple-patterning operation, to pattern a hard mask layer in order to pattern a target layer of a semiconductor wafer. FIG. 8 shows a cross-sectional view of the first photomask PM11 along a line A-A' in FIG. 7.

Figure 10:
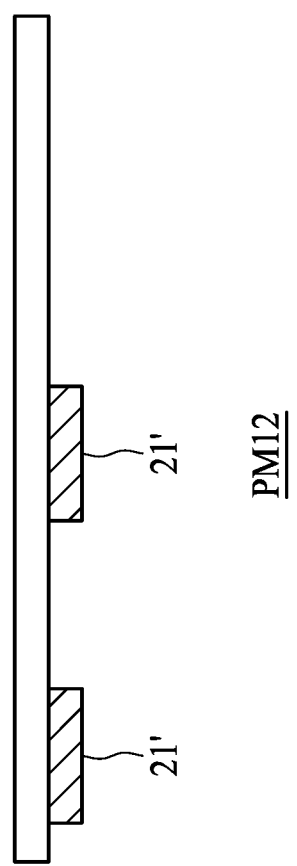
FIG. 10 is a cross-sectional view of a photomask in accordance with some embodiments of the present disclosure.

In accordance with some embodiments of the present invention, as shown in FIG. 9, the method M10 can further include operations of outputting the second layout DL12 into a second photomask PM12. The second photomask PM12 includes a plurality of patterns 21' corresponding to the second patterns 21 of the second layout DL12. The second photomask PM12 is used to pattern the hard mask layer in order to pattern the target layer of the semiconductor wafer, e.g. in a double-patterning operation or a multiple-patterning operation. FIG. 10 shows a cross-sectional view of the second photomask PM12 along a line B-B' in FIG. 9.

Figure 11:
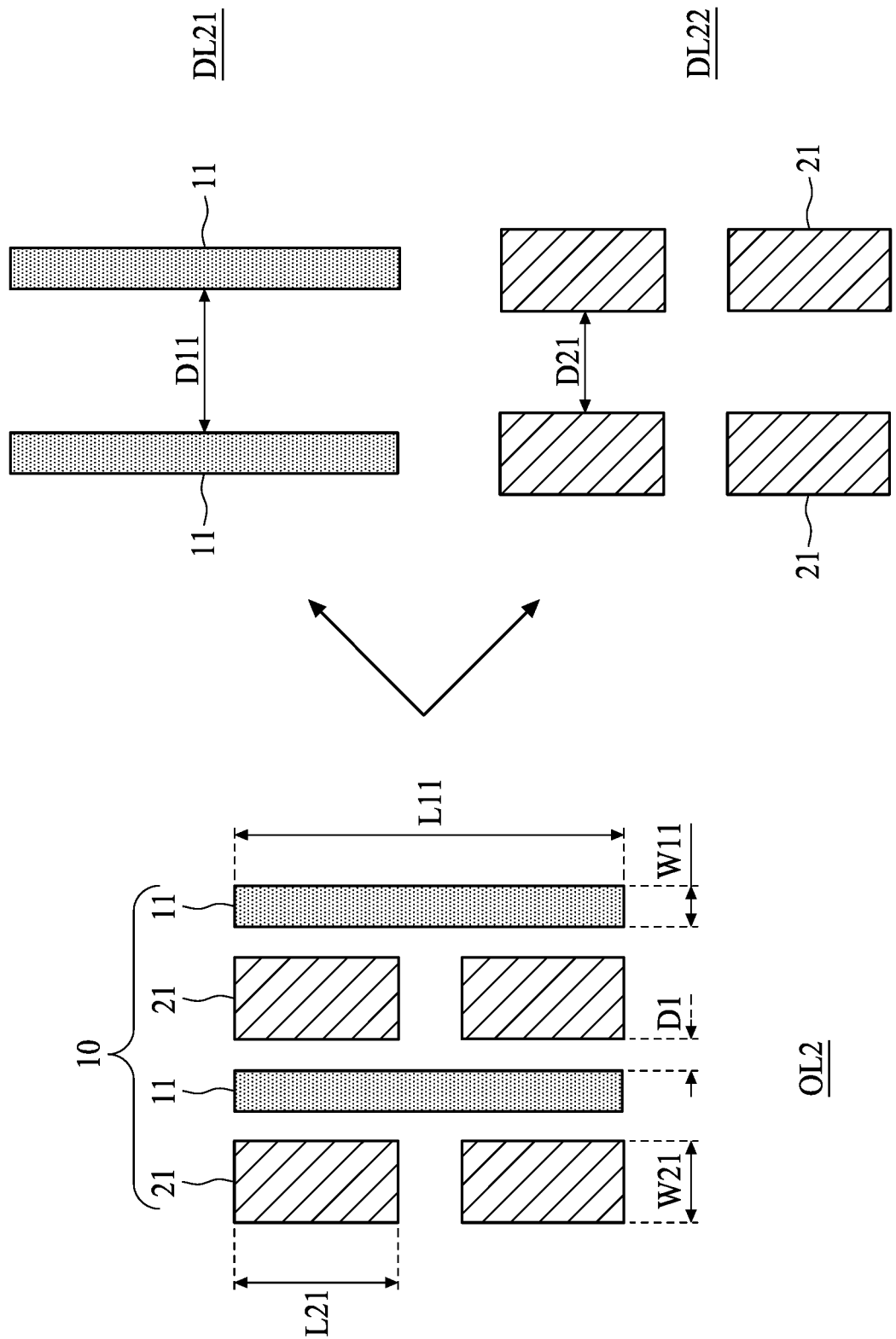

To further illustrate the concepts of the present disclosure, other embodiments of the present disclosure are provided below following the method M10 as illustrated above. In accordance with operation (O11) of the method M10 and some embodiments of the present disclosure, as shown in FIG. 11, an initial layout OL2 is received. Similar to the initial layout OL1, the initial layout OL2 includes a plurality of original patterns 10. The original patterns 10 are separated from each other by an original spacing distance D1. The original patterns 10 of the initial layout OL1 include a plurality of first patterns 11 and a plurality of second patterns 21. The first patterns 11 have a width W11 and a length L11, and the second patterns 21 have a width W21 and a length L21. For ease of illustration and understanding, in some embodiments of the present disclosure, the original spacing distance D1 between adjacent original patterns 10 are the same, and each of the original patterns 10 is a rectangle. In some embodiments, all the first patterns 11 have the same rectangular shape, and all the second patterns 21 have the same rectangular shape. As for the initial layout OL2, the width W21 of the second patterns 21 is greater than the width W11 of the first patterns 11, and the length L21 of the second patterns 21 less than the length L11 of the first patterns 11.

It should be noted that, for ease of illustration and understanding, the numeral references used in the initial layout OL2 are the same as those used in the initial layout OL1. Such numeral references are not intended to limit different embodiments of the present disclosure into the same elements. Repeated numeral references are used in layouts DL21 and DL22 and photomasks PM21 and PM22 to represent different elements with similar or same functions or properties, but are not intended to limit the present disclosure. In addition, in the following descriptions, illustrations of embodiments that are similar to the above embodiments are omitted for brevity.

Figure 12:
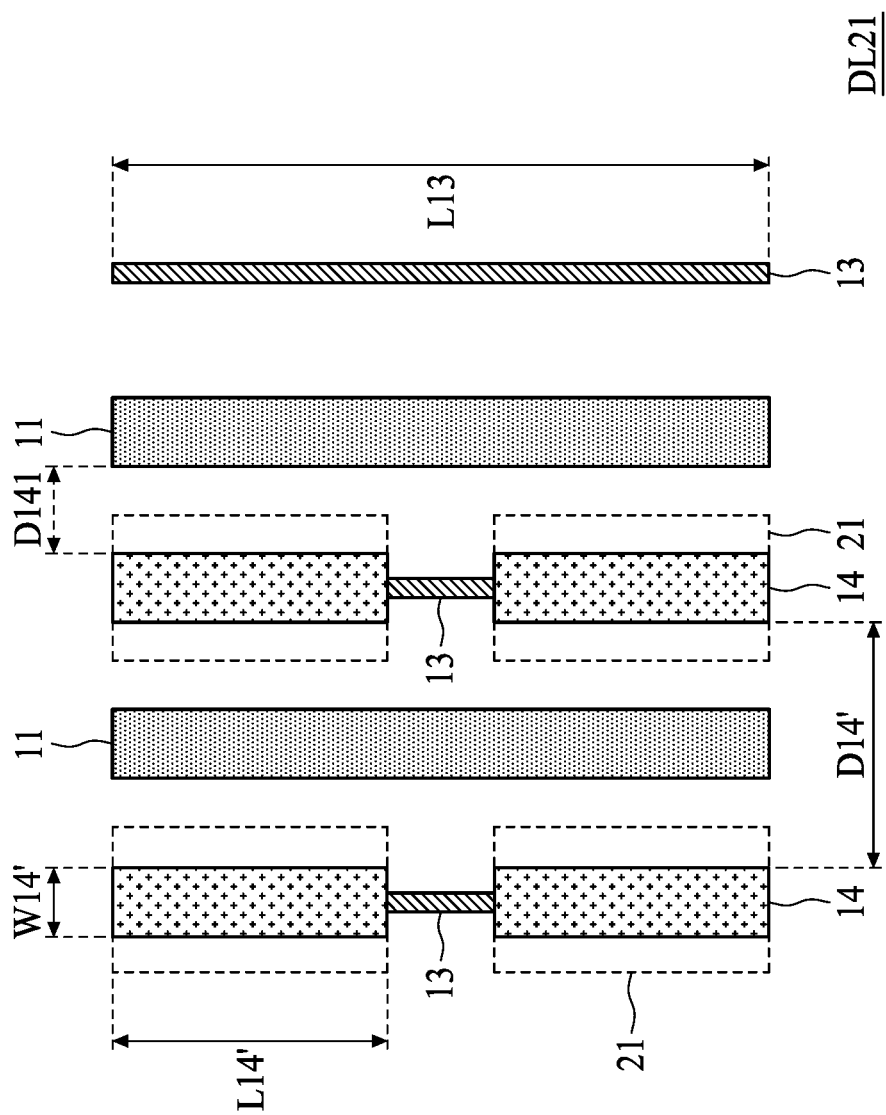

In accordance with operations (O12) to (O16) of the method M10 as illustrated above, fourth patterns 14 with increased widths W14' of a first layout DL21 are provided as shown in FIG. 12. Repeated illustrations are omitted herein, but such omissions are not intended to limit the present disclosure. Referring to FIG. 12, after the width increase, the fourth pattern 14 entirely overlaps the corresponding second patterns 21 when the second layout DL22 overlaps the first layout DL21. The second patterns of the second layout DL22 are shown in dotted lines overlaid on the first layout DL21 to illustrate relative positions of the first patterns 11, the second patterns 21, the third patterns 13 and the fourth patterns 14 of the first layout DL21 and the second layout DL22. The fourth pattern 14 having the width W14' is entirely within a coverage area of the second pattern 21 when the second layout DL22 overlaps the first layout DL21.

In some embodiments, a length L14' of the fourth patterns 14 is less than a length L13 of the third patterns 13 and the length L11 of the first patterns 11. In some embodiments, relationships of the width W14' and the first width W11 of the first layout DL21 are similar to relationships of the width W14' and the first width W1 of the first layout DL11. In some embodiments, relationships of a spacing distance D14' and the first spacing distance D11 of the first layout DL21 are similar to relationships of the spacing distance D14' and the first spacing distance D11 of the first layout DL11. In some embodiments, spacing distances D141 between the first patterns 11 and adjacent fourth patterns 14 having the width W14' are substantially equal, wherein a difference between the values is less than or equal to ±10%. In some embodiments, the spacing distances D141 between the fourth patterns 14 and adjacent first patterns 11 are the same. Thus, with the fourth patterns 14 and the first patterns 11, the first layout DL21 can have more repetitive, and periodic patterns.

In some embodiments, the third patterns 13 are non-printable scattering bars, and the fourth patterns 14 are printable scattering bars. In some embodiments, at least a portion of the third patterns 13 are coupled with or in contact with the fourth patterns 14. In some embodiments, at least a portion of third patterns 13 (e.g., the third pattern 13 on the right side of FIG. 12) are separated from the fourth patterns 14.

Figure 14:
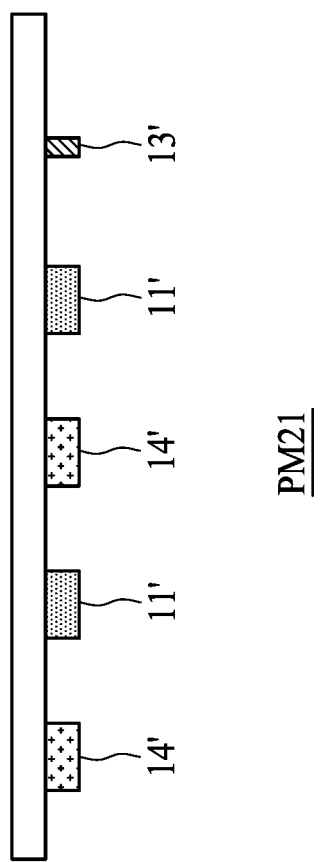
FIGS. 14 to 15 are cross-sectional views of a photomask in accordance with some embodiments of the present disclosure.
Figure 15:
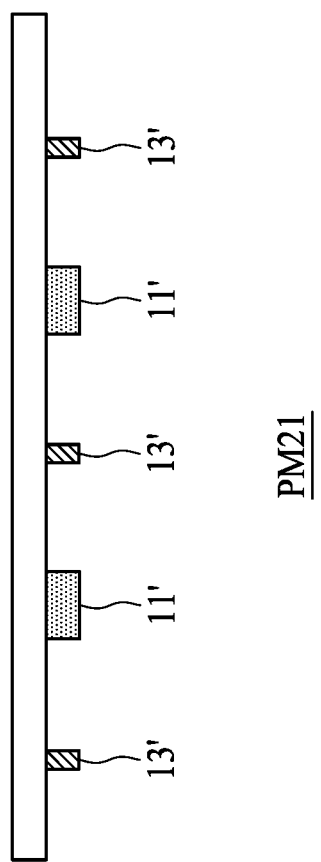

In accordance with operation (O17) of the method M10 and some embodiments of the disclosure, referring to FIG. 13, the first layout DL21, including the first patterns 11, the third patterns 13, and the fourth patterns 14 having the width W14' are outputted into a first photomask PM21. The first photomask PM21 includes a plurality of patterns 11' corresponding to the first patterns 11, a plurality of patterns 13' corresponding to the third patterns 13, and a plurality of patterns 14' corresponding to the fourth patterns 14 of the first layout DL2. The first photomask PM21 is used, e.g. in a double-patterning operation or a multiple-patterning operation, to pattern a hard mask layer in order to pattern a target layer of a semiconductor wafer. FIGS. 14 and 15 show cross-sectional views of the first photomask PM21 along a line C-C' and a line D-D' in FIG. 13 respectively.

Figure 17:
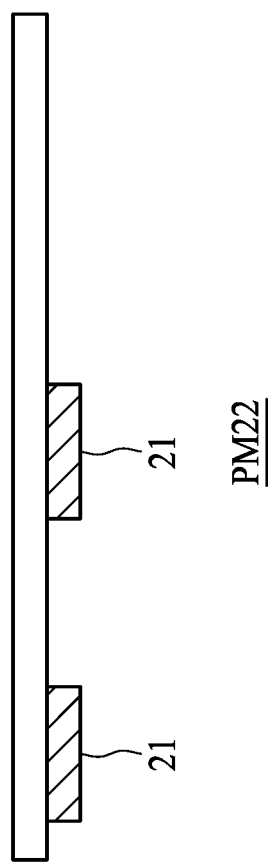
FIG. 17 is a cross-sectional view of a photomask in accordance with some embodiments of the present disclosure.

In accordance with some embodiments of the present invention, as shown in FIG. 16, the method M10 can further includes operations of outputting the second layout DL22 into a second photomask PM22. The second photomask PM22 includes a plurality of patterns 21' corresponding to the second patterns 21 of the second layout DL12. The second photomask PM22 is used to pattern the hard mask layer in order to pattern the target layer of the semiconductor wafer, e.g. in a double-patterning operation or a multiple-patterning operation. FIG. 17 shows a cross-sectional view of the second photomask PM22 along a line E-E' in FIG. 16.

In some embodiments of the present disclosure, a double-patterning operation can be performed using the above-illustrated first photomask PM11 and second photomask PM12 to apply desired patterns onto a hard mask layer or a target layer of a semiconductor wafer. In the following description, for ease of illustration and understanding, similar or same elements with similar or same functions or properties use the same numeral references repeatedly, but such use of same numeral references is not intended to limit the present disclosure. In the following illustrated embodiments, the fourth patterns can be represented as first (or printable) scattering bars, and the third patterns can be represented as second (or non-printable) scattering bars.

Figure 18:
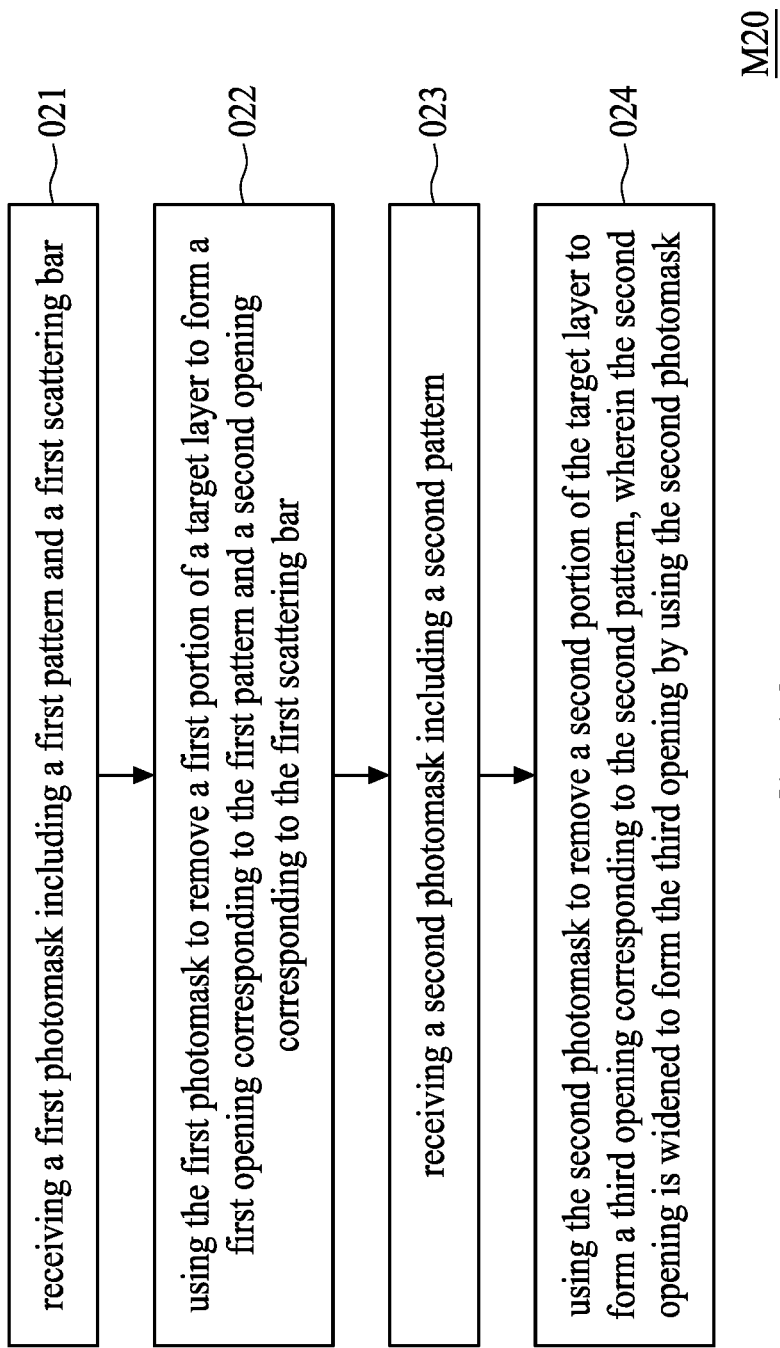
FIG. 18 is a flowchart in accordance with some embodiments of the present disclosure.

Some embodiments of the present disclosure provide a semiconductor manufacturing method M20. Referring to FIG. 18, the semiconductor manufacturing method M20 includes operations of: (O21) receiving a first photomask including a first pattern and a first scattering bar; (O22) using the first photomask to remove a first portion of a target layer to form a first opening corresponding to the first pattern and a second opening corresponding to the first scattering bar; (O23) receiving a second photomask including a second pattern; and (O24) using the second photomask to remove a second portion of the target layer to form a third opening corresponding to the second pattern, wherein the second opening is widened to form the third opening using the second photomask.

Figure 19:
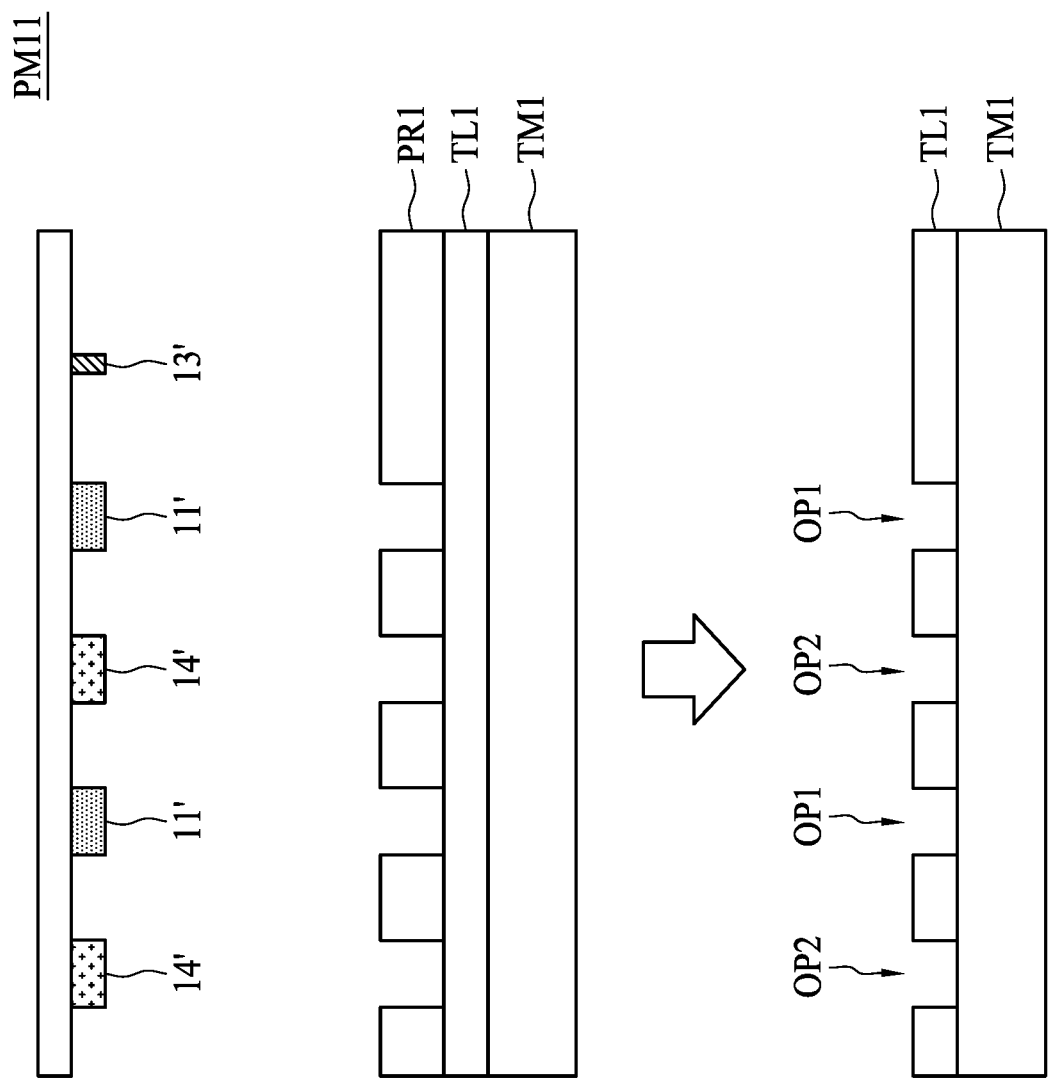
FIGS. 19 to 20 are diagrams showing one or more operations of a semiconductor manufacturing method in accordance with some embodiments of the present disclosure.

In accordance with operation (O21) of the method M20 and some embodiments of the present disclosure, referring to FIG. 19, the first photomask PM11 is received. In accordance with some embodiments, the first photomask PM11 includes a plurality of first patterns 11', a plurality of first scattering bars 14', and a second scattering bar 13', wherein the first scattering bars 14' are printable onto a photoresist layer, and the second scattering bar 13' is not printable onto a photoresist layer.

Referring to FIG. 19, a substrate including a material layer TM1 and a target layer TL1 disposed on the material layer TM1 is received. The material layer TM1 can be a semiconductor material layer or a semiconductor wafer. In accordance with operation (O22) of the method M20, the first photomask PM11 is used to remove a first portion of the target layer TL1 to form a first opening OP corresponding to the first pattern 11' and a second opening OP2 corresponding to the first scattering bar 14'. As shown in FIG. 19, a photoresist layer is formed on the target layer TL. The first photomask PM11 is transferred onto the photoresist layer; in other words, the first patterns 11' and the first scattering bars 14' are transferred to the photoresist layer PR1 to form a patterned photoresist layer PR1. The patterned photoresist layer PR1 includes a plurality of openings corresponding to the first patterns 11' and the first scattering bars 14'. The patterned photoresist layer PR1 is used as a mask to remove the first portion of the target layer TL1 in order to transfer the first patterns 11' and the first scattering bars 14' onto the target layer TL1, e.g. by etching operations. The target layer TL1 including the first openings OP1 and the second openings OP2 is formed. The patterned photoresist layer PR1 is removed.

Figure 20:
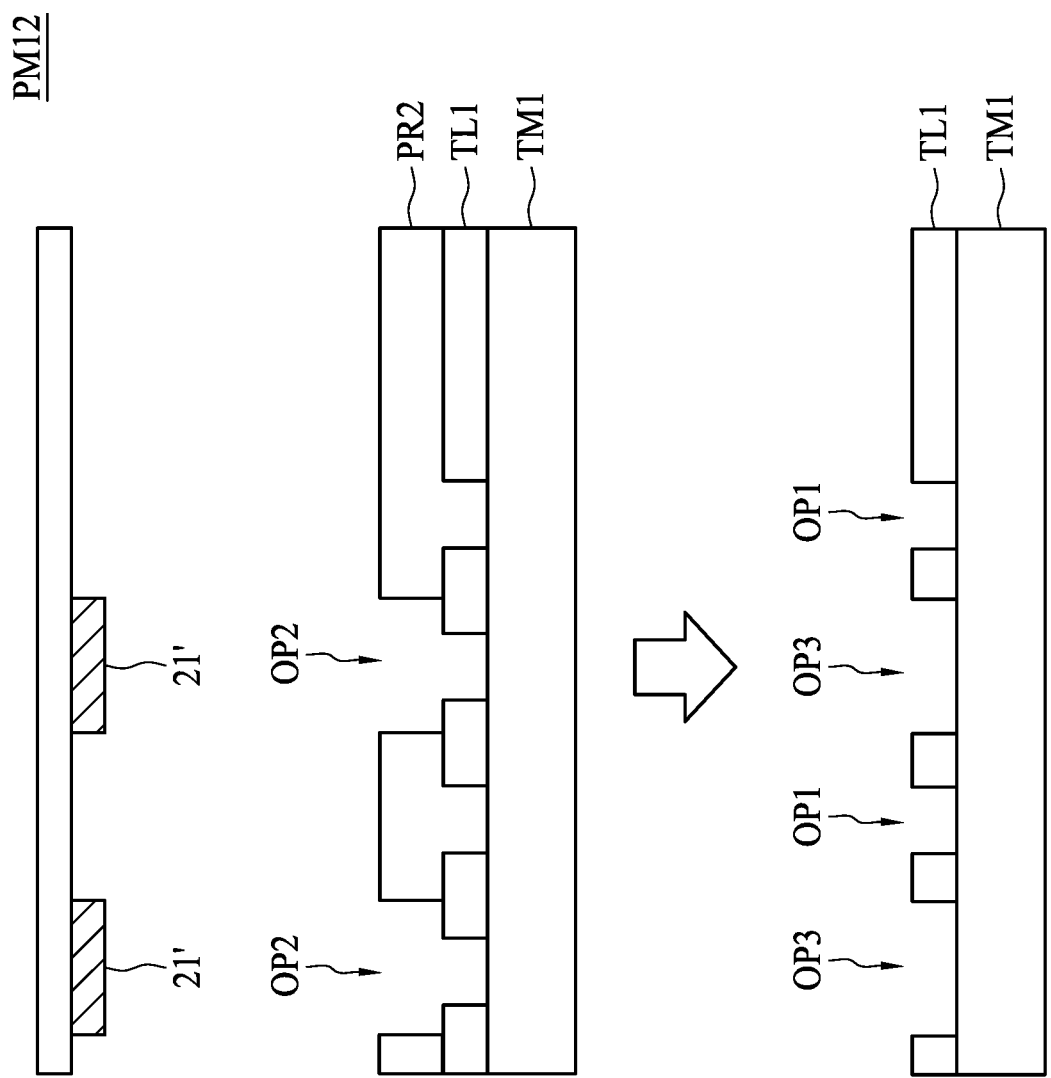

In accordance with operations (O23) to (O24) of the method M20 and some embodiments of the present disclosure, referring to FIG. 20, the second photomask PM12 is received. The second photomask PM12 includes at least a second pattern 21'. The second photomask PM12 is used to remove a second portion of the target layer TL1 to form a third opening OP3 corresponding to the second pattern 21'. As shown in FIG. 20, a photoresist layer is formed on the target layer TL1 after formation of the first openings OP1 and the second openings OP2, and optionally after removal of the photoresist PR1. The second photomask PM12 is transferred onto the photoresist layer; in other words, the second patterns 21' are transferred onto the photoresist layer to form a patterned photoresist layer PR2. The patterned photoresist layer PR2 includes a plurality of openings corresponding to the second patterns 21'. The patterned photoresist layer PR2 is used as a mask to remove the first portion of the target layer TL1 in order to transfer the second patterns 21' onto the target layer TL1, e.g. by etching operations. The third openings OP3 corresponding to the second patterns 21' are formed on the target layer TL1, wherein the second openings OP2 are widened to become the third openings OP3. As illustrated above in the method M10 for forming a photomask, the fourth patterns 14' totally overlap the second patterns 21, and thus the second opening OP2 is within a coverage area of the third opening OP3. The target layer TL1, including the third openings OP3 corresponding to the second patterns 21 and the first openings OP1 corresponding to the first patterns 11', is formed. The patterned photoresist layer PR2 is removed.

FIGS. 19 to 20 show cross-sectional views of the first photomask PM11 and the second photomask PM12. A top view of the first photomask PM11 is shown in FIG. 7. The first photomask PM11 can also include a second scattering bar 13'. In some embodiments, a width W13' of the second scattering bar 13' is less than a width W14" of the first scattering bars 14' and a width W11' of the first patterns 11'. In some embodiments of the first photomask PM11, the first scattering bar 14' and the second scattering bar 13' are separated. In some embodiments of the first photomask PM21, the first scattering bar 14' is coupled to the second scattering bar 13' (connected or in contact).

Some embodiments of the present disclosure provide a photomask including both non-printable scattering bars and printable scattering bars. Using the first photomask PM21 as shown in FIGS. 13 to 15 for illustration, the photomask PM21 includes a first pattern 11', a printable scattering bar 14', and a non-printable scattering bar 13'. The first pattern 11' has a width W11'. The printable scattering bar 14' is adjacent to the first pattern 11', and has a width W14". The non-printable scattering bar 13' is adjacent to the first patterns 11', and has a width W11'. The width W11' of the first pattern 11 and the width W14" of the printable scattering bar 14' are both greater than the width W13' of the non-printable scattering bar 13'. A spacing distance D141' between the first pattern 11' and the printable scattering bar 14' is less than or equal to a spacing distance D131' between the first pattern 11' and the non-printable scattering bar 13'. In some embodiments, the printable scattering bar 14' and the non-printable scattering bar 13' are coupled. In some embodiments, the printable scattering bar 14' and the non-printable scattering bar 13' are separated from each other by the first pattern 11'.

Some embodiments of the present disclosure provide a method for forming a photomask. The method includes: receiving an initial layout of an optical lithography tool in a processor, the initial layout comprising a first pattern and a second pattern; decomposing the initial layout into a first layout including the first pattern and a second layout including the second pattern; inserting a third pattern into the first layout; overlapping the first layout including the first pattern and the third pattern to the second layout including the second pattern; increasing a width of the third pattern in the first layout overlapping the second pattern in the second layout to form a fourth pattern in the first layout; and outputting the first layout comprising the first pattern, the third pattern and the fourth pattern into a first photomask.

Some embodiments of the present disclosure provide a method for manufacturing a semiconductor structure. The method includes: receiving a first photomask including a first pattern and a first scattering bar; using the first photomask to remove a first portion of a target layer to form a first opening corresponding to the first pattern and a second opening corresponding to the first scattering bar; receiving a second photomask including a second pattern; and using the second photomask to remove a second portion of the target layer to form a third opening corresponding to the second pattern, wherein the second opening is widened to form the third opening using the second photomask.

Some embodiments of the present disclosure provide a photomask. The photomask includes a first pattern, having a first width; a printable scattering bar, adjacent to the first pattern, and having a second width; and a non-printable scattering bar, adjacent to the first pattern and having a third width, wherein the first width of the first pattern and the second width of the printable scattering bar are greater than the third width of the non-printable scattering bar, and a spacing distance between the first pattern and the printable scattering bar is less than or equal to a spacing distance between the first pattern and the non-printable scattering bar.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a photomask, comprising:
receiving an initial layout of an optical lithography tool in a processor, the initial layout comprising a first pattern and a second pattern;
decomposing the initial layout into a first layout including the first pattern and a second layout including the second pattern;
inserting a third pattern into the first layout;
overlapping the first layout including the first pattern and the third pattern to the second layout including the second pattern, wherein, from a top view, the third pattern overlaps the second pattern;
increasing a width of the third pattern in the first layout overlapping the second pattern in the second layout to form a fourth pattern in the first layout; and
outputting the first layout comprising the first pattern, the third pattern and the fourth pattern into a first photomask.

2. The method of claim 1, wherein a width of the first pattern is different from a width of the second pattern.

3. The method of claim 1, wherein a width of the third pattern is less than a width of the first pattern.

4. The method of claim 1, wherein a width of the fourth pattern is substantially same as a width of the first pattern.

5. The method of claim 1, wherein a length of the fourth pattern is substantially same as a length of the first pattern.

6. The method of claim 1, wherein a length of the fourth pattern is less than a length of the first pattern.

7. The method of claim 1, wherein the fourth pattern is entirely within an area of the second pattern when the first layout overlaps the second layout.

8. The method of claim 1, wherein the first pattern and the fourth pattern are same periodic pattern with an offset.

9. The method of claim 1, further comprising:
outputting the second layout into a second photomask.

10. A method for forming a photomask, comprising:
receiving an initial layout in a processor, the initial layout comprising at least two periodic patterns;
decomposing the initial layout into a first layout comprising a first periodic pattern and a second layout comprising a second periodic pattern;
interposing a third periodic pattern into the first layout;
overlapping the first layout to the second layout, wherein, from a top view, the third periodic pattern overlaps a first region of the second periodic pattern, and a second region of the second periodic pattern is free from being covered by the third periodic pattern; and
increasing a width of the third periodic pattern in the first layout overlapping the second periodic pattern in the second layout to form a fourth periodic pattern in the first layout.

11. The method of claim 10, further comprising:
outputting the first layout into a first photomask.

12. The method of claim 10, further comprising:
outputting the second layout into a second photomask.

13. The method of claim 10, wherein a width of the first periodic pattern is different from a width of the second periodic pattern.

14. The method of claim 10, wherein a width of the first periodic pattern is greater than a width of the third periodic pattern.

15. The method of claim 10, wherein a width of the fourth periodic pattern is substantially equal to a width of the first periodic pattern.

16. The method of claim 10, wherein a length of the fourth periodic pattern is substantially equal to or less than a length of the first periodic pattern.

17. A method for forming a photomask, comprising:
receiving an initial layout, the initial layout comprising at least two patterns;
decomposing the initial layout into a first layout comprising a first pattern and a second layout comprising a second pattern;
inserting a plurality of scattering bars into the first layout;
overlapping a first portion of the plurality of scattering bars in the first layout to the second pattern in the second layout, wherein the first portion of the plurality of scattering bars includes printable scattering bars;
enlarging a width of the first portion of the plurality of scattering bars; and
outputting the first layout into a photomask.

18. The method of claim 17, wherein a second portion of the plurality of scattering bars is non-enlarged.

19. The method of claim 18, wherein the second portion of the plurality of scattering bars includes non-printable scattering bars.

20. The method of claim 17, wherein the width of the first portion of the plurality of scattering bars is substantially equal to a width of the first pattern.

* * * * *